US012183555B2

(12) United States Patent
Baek et al.

(10) Patent No.: US 12,183,555 B2
(45) Date of Patent: Dec. 31, 2024

(54) SUBSTRATE PROCESSING APPARATUS AND METHOD OF MANUFACTURING SEMICONDUCTOR DEVICE USING THE SAME

(71) Applicant: Samsung Electronics Co., Ltd., Suwon-si (KR)

(72) Inventors: Seunghan Baek, Busan (KR); Sangki Nam, Seongnam-si (KR); Dongseok Han, Daegu (KR); Namkyun Kim, Pyeongtaek-si (KR); Kwonsang Seo, Suwon-si (KR); Kuihyun Yoon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 226 days.

(21) Appl. No.: 17/981,874

(22) Filed: Nov. 7, 2022

(65) Prior Publication Data

US 2023/0143049 A1    May 11, 2023

(30) Foreign Application Priority Data

Nov. 10, 2021  (KR) ........................ 10-2021-0153865

(51) Int. Cl.
  *H01J 37/32*  (2006.01)
(52) U.S. Cl.
  CPC .. *H01J 37/32642* (2013.01); *H01J 37/32532* (2013.01)

(58) Field of Classification Search
  CPC .......... H01J 37/32642; H01J 37/32532; H01J 37/32715; H01L 21/6833; H01L 21/67069; H01L 21/68735; B23Q 3/15; H02N 13/00
  See application file for complete search history.

(56) References Cited

U.S. PATENT DOCUMENTS

| | | | |
|---|---|---|---|
| 6,076,636 | A | 6/2000 | Tietge |
| 6,723,202 | B2 | 4/2004 | Nagaiwa et al. |
| 10,566,175 | B2 | 2/2020 | Nagayama et al. |
| 10,593,520 | B2 | 3/2020 | Wu et al. |
| 2017/0018411 | A1 | 1/2017 | Sriraman et al. |

(Continued)

FOREIGN PATENT DOCUMENTS

KR    101893035 B1    8/2018

*Primary Examiner* — Minh D A
(74) *Attorney, Agent, or Firm* — Muir Patent Law, PLLC

(57) ABSTRACT

Provided are a substrate processing apparatus and a method of manufacturing a semiconductor device using the same. The substrate processing apparatus includes a lower electrode assembly, an upper electrode assembly disposed on the lower electrode assembly, and a plasma processing region between the lower electrode assembly and the upper electrode assembly. The lower electrode assembly includes a substrate support supporting a substrate, a coupling ring assembly surrounding the substrate support, an edge ring on the coupling ring assembly, and at least one upper contact pad contacting a lower surface of the edge ring and contacting at least one of the substrate support and the coupling ring assembly, the at least one upper contact pad being conductive. The coupling ring assembly includes a coupling ring and a conductive side contact pad in contact with a side surface of the substrate support and an inner surface of the coupling ring.

20 Claims, 18 Drawing Sheets

(56) References Cited

U.S. PATENT DOCUMENTS

| | | | |
|---|---|---|---|
| 2017/0338084 A1* | 11/2017 | Nishijima | H01J 37/3255 |
| 2019/0006155 A1 | 1/2019 | Zhao et al. | |
| 2020/0335376 A1* | 10/2020 | Sun | H01L 21/6833 |
| 2021/0027980 A1* | 1/2021 | Koshimizu | H01J 37/32642 |
| 2021/0159057 A1 | 5/2021 | Koshimizu | |
| 2021/0343508 A1* | 11/2021 | Nguyen | H01J 37/32477 |

* cited by examiner

SUBSTRATE PROCESSING APPARATUS AND METHOD OF MANUFACTURING SEMICONDUCTOR DEVICE USING THE SAME

CROSS-REFERENCE TO RELATED APPLICATION(S)

This application claims the benefit of priority under 35 U.S.C. § 119 to Korean Patent Application No. 10-2021-0153865 filed on Nov. 10, 2021 in the Korean Intellectual Property Office, the disclosure of which is incorporated herein by reference in its entirety.

BACKGROUND

Aspects of the present inventive concept relate to a substrate processing apparatus and a method of manufacturing a semiconductor device using the same.

A deposition process or an etching process, among semiconductor processes for manufacturing a semiconductor device, have been performed with a substrate processing apparatus using plasma. With the trend for a large diameter of a semiconductor wafer and high integration of a semiconductor device, a process difficulty of a deposition process and an etching process has increased.

SUMMARY

An aspect of the present inventive concept is to provide a substrate processing apparatus capable of performing a uniform plasma process on a substrate.

An aspect of the present inventive concept is also to provide a substrate processing apparatus capable of controlling a plasma sheath region.

An aspect of the present inventive concept is also to provide a method of manufacturing a semiconductor device using the substrate processing apparatus.

According to an aspect of the present inventive concept, a substrate processing apparatus is provided. The substrate processing apparatus includes a substrate support configured to support a substrate, the substrate support including lower region and an upper region, the lower region including a central region and an outer region surrounding the central region, and the upper region disposed on the central region of the lower region, a coupling ring assembly surrounding a side surface of the lower region of the substrate support, an edge ring disposed on the coupling ring assembly and the outer region of the lower region of the substrate support and surrounding a side surface of the upper region of the substrate support, and at least one upper contact pad contacting a lower surface of the edge ring and contacting an upper surface of the outer region of the lower regions of the substrate support and an upper surface of the coupling ring assembly, the at least one upper contact pad being conductive. The coupling ring assembly includes a coupling ring and a conductive side contact pad in contact with a side surface of the substrate support and an inner surface of the coupling ring.

According to another aspect of the present inventive concept, a substrate processing apparatus is provided. The substrate processing apparatus includes a lower electrode assembly, an upper electrode assembly disposed on the lower electrode assembly, and a plasma processing region between the lower electrode assembly and the upper electrode assembly. The lower electrode assembly includes a substrate support configured to support a substrate; a coupling ring assembly surrounding the substrate support, an edge ring on the coupling ring assembly, and at least one upper contact pad contacting a lower surface of the edge ring and contacting at least one of the substrate support and the coupling ring assembly, the at least one upper contact pad being conductive. The coupling ring assembly includes a coupling ring and a conductive side contact pad in contact with a side surface of the substrate support and an inner surface of the coupling ring.

According to another aspect of the present inventive concept, a method of manufacturing a semiconductor device is provided. The method of manufacturing a semiconductor device includes: preparing a substrate processing apparatus including a lower electrode assembly, an upper electrode assembly disposed on the lower electrode assembly; and a plasma processing region between the lower electrode assembly and the upper electrode assembly, wherein the lower electrode assembly of the substrate processing apparatus includes a substrate support supporting a substrate, a coupling ring assembly surrounding the substrate support, an edge ring on the coupling ring assembly, and at least one conductive upper contact pad contacting at least one of the substrate support and the coupling ring assembly, while contacting a lower surface of the edge ring, and the coupling ring assembly includes a conductive side contact pad contacting a side surface of the substrate support and the coupling ring assembly and contacting an inner surface of the coupling ring assembly; loading the substrate onto the substrate support in the substrate processing apparatus; generating plasma in the plasma processing region to form a plasma region; and performing plasma processing, while heat generated in the plasma processing region on the edge ring is dissipated through the edge ring, the at least one upper contact pad, the coupling ring assembly, the side contact pad, and the substrate support of the substrate processing apparatus.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
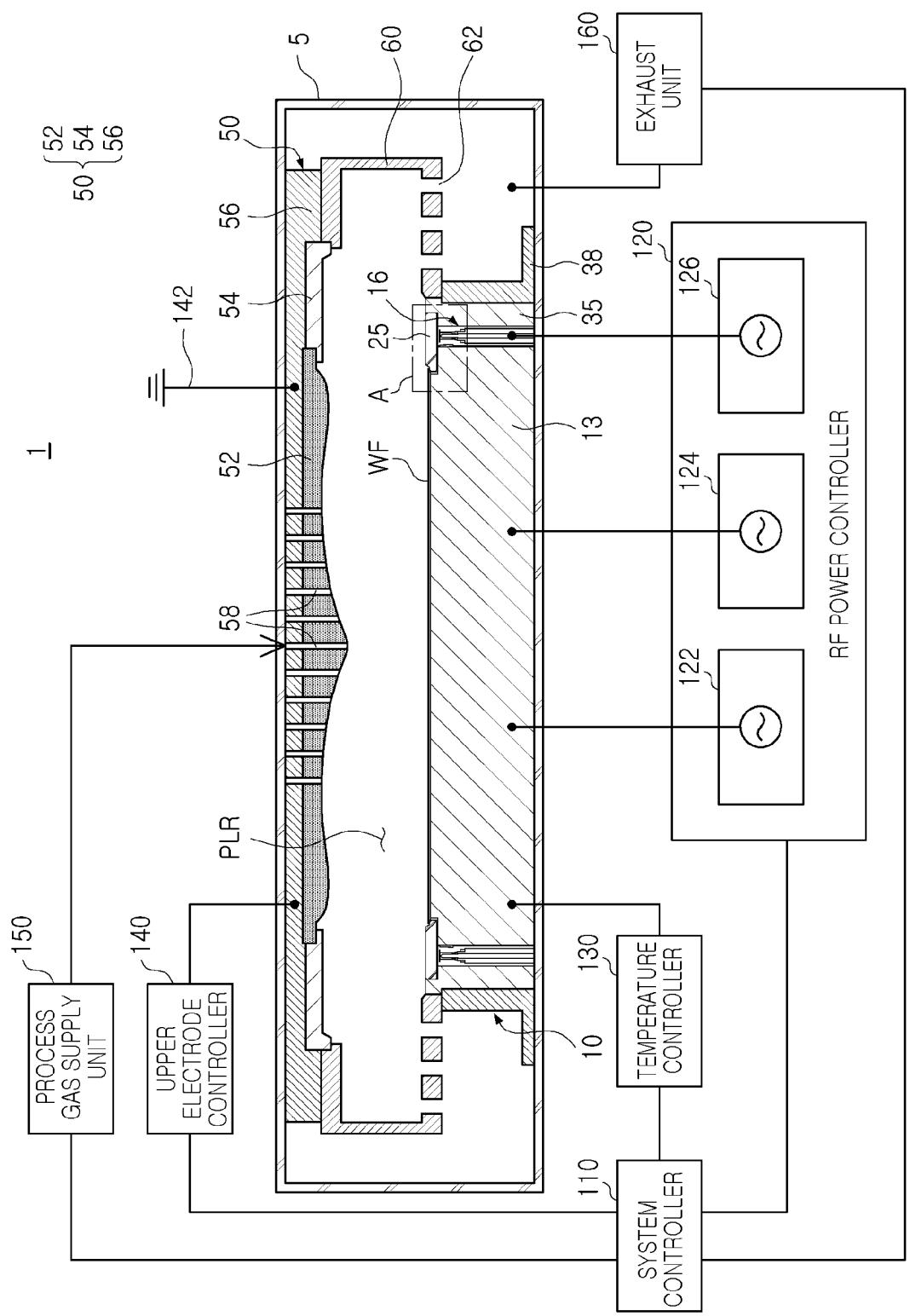
FIG. 1 is a conceptual diagram of a substrate processing apparatus according to embodiments of the present inventive concept.
Figure 2A:
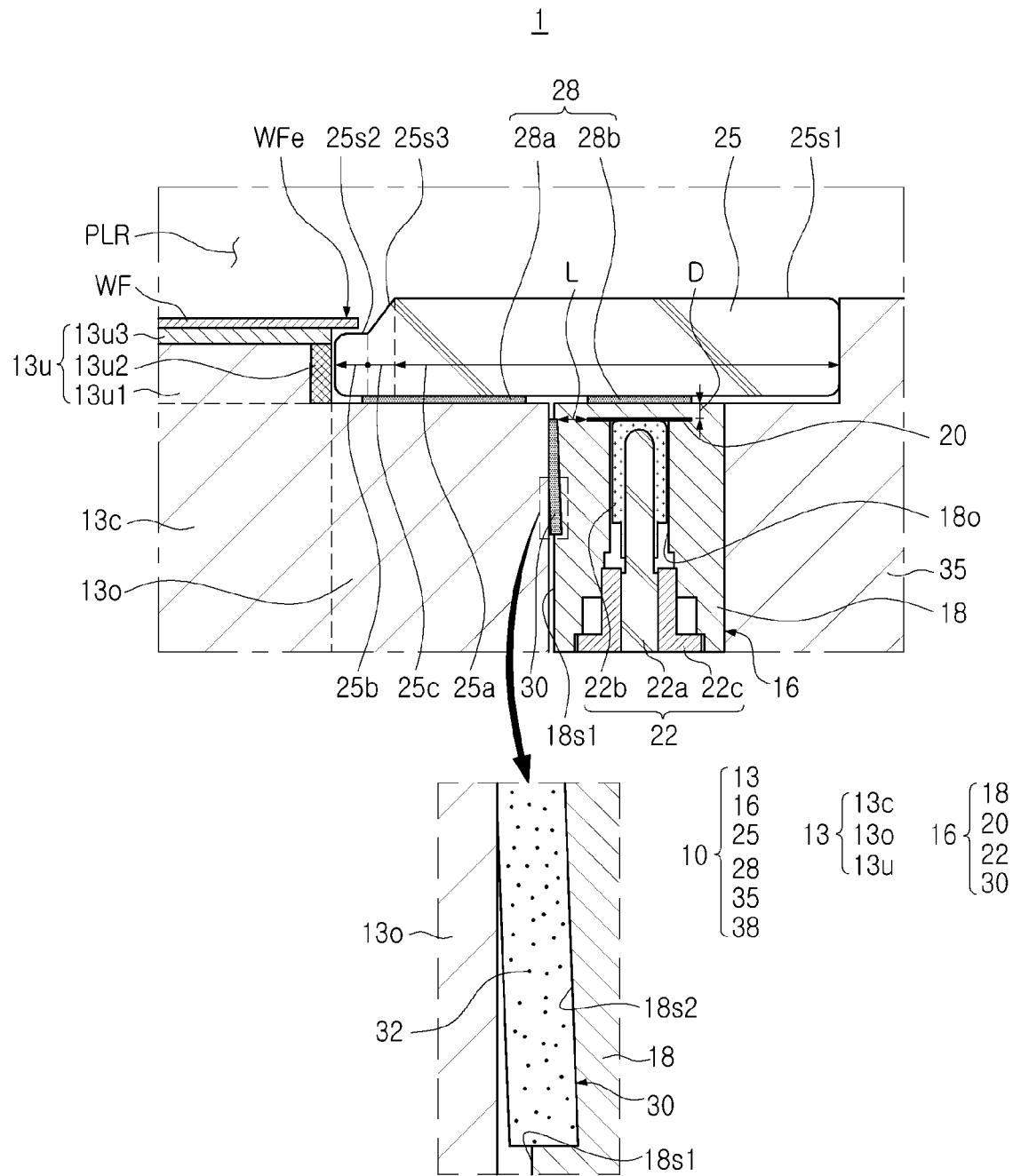
FIG. 2A is a partially enlarged cross-sectional view schematically illustrating a substrate processing apparatus according to an example embodiment of the present inventive concept.
Figure 2B:
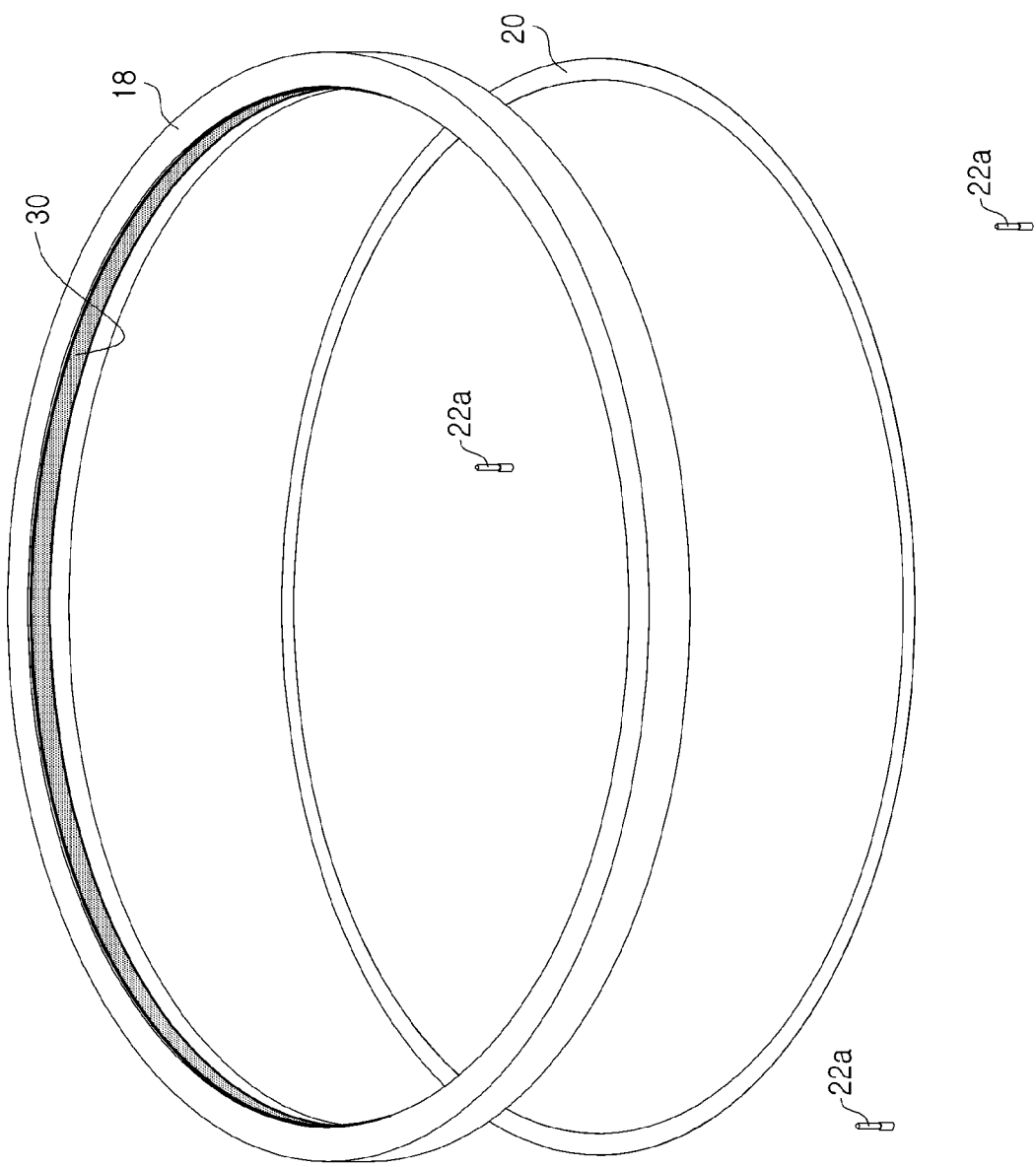
FIG. 2B is an exploded perspective view schematically illustrating some components of a substrate processing apparatus according to an embodiment of the present inventive concept.
Figure 3:
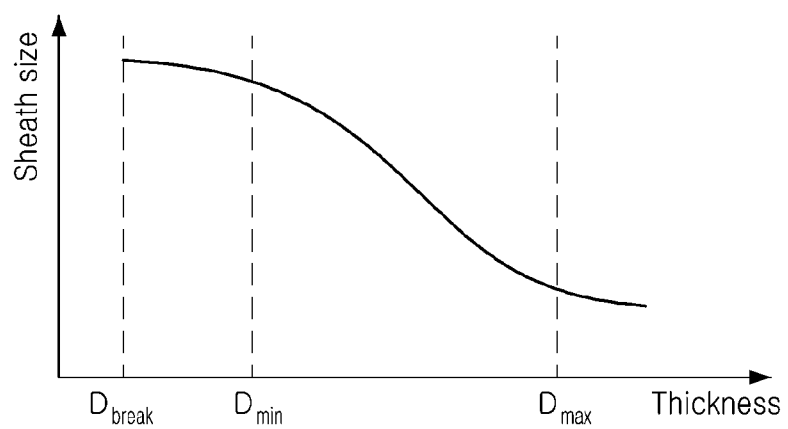
FIG. 3 is a graph illustrating a relationship between a sheath size and a partial thickness of a coupling ring in order to describe some components of a substrate processing apparatus according to an embodiment of the present inventive concept.

First, a substrate processing apparatus according to embodiments of the present inventive concept will be described with reference to FIGS. 1, 2A, 2B and 3. FIG. 1 is a conceptual view of a substrate processing apparatus according to embodiments of the present inventive concept, FIG. 2A is a schematic partial enlarged cross-sectional view of a portion indicated by 'A' of FIG. 1, FIG. 2B is an exploded perspective view schematically illustrating some components of a substrate processing apparatus according to an embodiment, and FIG. 3 is a graph illustrating a relationship between a sheath size and a partial thickness of a coupling ring in order to describe some components of a substrate processing apparatus according to an embodiment of the present inventive concepts.

Referring to FIGS. 1, 2A, 2B and 3, a substrate processing apparatus 1 according to an embodiment may include a plasma processing chamber 5, a lower electrode assembly 10 disposed in the plasma processing chamber 5, an upper electrode assembly 50 disposed on the lower electrode assembly 10, a plasma processing region PLR between the lower electrode assembly 10 and the upper electrode assembly 50, and a plasma confinement ring 60 defining a side of the plasma processing region PLR.

The lower electrode assembly 10 may include a substrate support 13 supporting a substrate WF, a coupling ring assembly 16 surrounding the substrate support 13, an edge ring on the coupling ring assembly 16 and at least one conductive upper contact pad 28 in contact with at least one of the substrate support 13 and the coupling ring assembly 16.

The substrate support 13 may be an electrostatic chuck (ESC) fixing the substrate WF by electrostatic force.

The substrate support 13 may include a lower region 13c and 13o and an upper region 13u. The lower region 13c and 13o may have a central region 13c and an outer region 13o surrounding the central region 13c. The upper region 13u may be disposed on the central region 13c of the lower region 13c and 13o.

The upper region 13u of the substrate support 13 may include an upper support 13u1 protruding from the central region 13c of the lower region 13c and 13o, a protective layer 13u2 surrounding a side surface of the upper support 13u1, and a capping layer 13u3 covering an upper surface of the upper support 13u1 and an upper surface of the protective layer 13u2 and contacting the substrate WF. The capping layer 13u3 that contacts the substrate WF may extend in a first horizontal direction ("first direction") and a second horizontal direction ("second direction") perpendicular to the first horizontal direction.

In the substrate support 13, the lower region 13c and 13o and the upper support 13u1 may include or may be formed of a conductive material such as aluminum or an aluminum alloy, and the protective layer 13u2 may include or may be formed of a material such as a rubber material or ceramic, and the capping layer 13u3 may include or may be formed of a material such as ceramic (e.g., $Al_2O_3$, etc.).

The coupling ring assembly 16 may include a coupling ring 18 and conductive side contact pad 30. The side contact pad 30 may be in contact with a side surface of the outer region 13o of the lower region 13c and 13o of the substrate support 13 and an inner surface of the coupling ring 18. The coupling ring 18 may have a lower opening 18o.

The side contact pad 30 may have a first side surface contacting the inner surface of the coupling ring 18 and a second side surface facing the first side surface. In the side contact pad 30, the entire first side surface may be in contact with the inner surface of the coupling ring 18, and part (e.g., a first portion) of the second side surface may be in contact with the substrate support 13, and the remainder (e.g., a second portion) may be spaced apart from the substrate support 13. As such, since part of the second side surface of the side contact pad 30 is in contact with the substrate support 13 and the remainder thereof is spaced apart from the substrate support 13, impedance may be lowered.

The coupling ring assembly 16 may further include an electrode expansion ring 20 disposed in the coupling ring 18 and partially overlapping the lower opening 18o in a vertical direction ("third direction"), the vertical direction being perpendicular to the first and second horizontal directions. The coupling ring assembly 16 may further include an electrode structure 22 inserted into the lower opening 18o and contacting the electrode expansion ring 20.

The coupling ring 18 may have inner surfaces 18s1 and 18s2 facing the outer region 13o of the lower region 13c and 13o of the substrate support 13 and spaced apart from the substrate support 13.

The inner surfaces 18s1 and 18s2 of the coupling ring 18 may have a first inner surface 18s1, perpendicular to an upper surface of the coupling ring 18 and a second inner surface 18s2 in a region recessed relative to the first inner surface 18s1.

The side contact pad 30 may be attached to the second inner surface 18s2 of the recessed region to fill the recessed region and protrude relative to the first inner surface 18s1 to contact the substrate support 13.

In the inner surfaces 18s1 and 18s2 of the coupling ring 18, the second inner surface 18s2 of the recessed region may be inclined with respect to an upper surface of the coupling ring 18. In the inner surfaces 18s1 and 18s2 of the coupling ring 18, the recessed region may be recessed to be deeper in a direction toward the lower surface of the coupling ring 18.

The coupling ring 18 may be formed of a dielectric material, for example, a ceramic such as $Al_2O_3$.

The electrode expansion ring 20 may be formed of a conductive material such as platinum (Pt) or tungsten (W).

A thickness, in the third direction, of the electrode expansion ring 20 may be within a range of about 5 μm to about 15 μm.

The electrode structure 22 may include a column-shaped electrode pillar 22a formed of a metal material such as Cu, a first connection material layer 22b, as a conductive layer, covering an upper surface and upper side surface of the electrode pillar 22a, contacting the electrode expansion ring 20, and electrically connecting the electrode pillar 22a and the electrode expansion ring 20, and a second connection material layer 22c surrounding a portion of the electrode pillar 22a below the first connection material layer 22b and contacting a side wall of the lower opening 18a to fix the electrode pillar 22a to the coupling ring 18.

The edge ring 25 may include a body region 25a having a first upper surface 25s1, an inner region 25b having a second upper surface 25s2 positioned at a level lower than a level of the first upper surface 25s1, and a buffer region 25c disposed between the body region 25a and the inner region 25b and having an inclined surface 25s3 extending from the first upper surface 25s1 to the second upper surface 25s2.

The inner region 25b of the edge ring 25 may have a side surface facing a side surface of the upper region 13u of the substrate support 13 and have a thickness, in the third direction, less than a thickness, in the third direction, of the upper region 13u of the substrate support 13. The body region 25a of the edge ring 25 may have a thickness, in the third direction, greater than the thickness, in the third direction, of the upper region 13u of the substrate support 13.

A lower surface of the edge ring 25 may be substantially flat (e.g., substantially planar). Terms such as "same," "equal," "flat," "planar," or "coplanar," as used herein encompass identicality or near identicality including variations that may occur, for example, due to manufacturing processes. The term "substantially" may be used herein to emphasize this meaning, unless the context or other statements indicate otherwise.

In the edge ring 25, the first upper surface 25s1 may be disposed at a level higher than that of the second upper surface 25s2, and the second upper surface 25s2 may be disposed at a level lower than that of the substrate WF supported by the upper region 13u of the substrate support 13.

In the edge ring 25, the body region 25a may cover the entire upper surface of the coupling ring 18 and cover a portion of the upper surface of the outer region 13o of the lower region 13c and 13o of the substrate support 13. In the edge ring 25, at least a portion of the inner region 25b may overlap, in the vertical direction, an edge region of the substrate WF supported by the substrate support 13.

The at least one upper contact pad 28 may include a first upper contact pad 28a and a second upper contact pad 28b spaced apart from each other. The first upper contact pad 28a may contact a lower surface of the edge ring 25 and an upper surface of the outer region 13o of the lower region 13c and 13o. The second upper contact pad 28b may contact a lower surface of the edge ring 25 and an upper surface of the coupling ring 18 of the coupling ring assembly 16.

A width, in the first direction, of the second upper contact pad 28b may be less than a width, in the first direction, of the coupling ring 18.

The lower electrode assembly 10 may include a buffer structure 35 surrounding an outer surface of the coupling ring assembly 16 and the edge ring 25 and a support structure 38 surrounding an outer surface of the buffer structure 35 and supporting the plasma confinement ring 60. The buffer structure 35 may be formed of a material such as quartz or ceramic.

The upper electrode assembly 50 may include an upper electrode 56 and first and second portions 52 and 54 defining an upper surface of the plasma processing region PLR below the upper electrode 56. The first and second portions 52 and 54 may include a first portion 52 facing the substrate WF supported by the substrate support 13 and a second portion 54 surrounding the first portion 52. The upper electrode 56 may be formed of a conductive material such as aluminum or an aluminum alloy. The first and second portions 52 and 54 may be formed of a material such as silicon (Si) or silicon carbide (SiC). A lower surface of the first portion 52 may form a curved surface so that a uniform plasma process may be performed. For example, the first portion 52 may be downwardly convex in a central region and may be convex in an edge region. The first portion 52 may further protrude downwardly, relative to the edge region of the central region to be convex.

The upper electrode assembly 50 may have shower holes 58 for injecting a process gas into the plasma processing region PLR.

The plasma confinement ring 60 may contact the upper electrode assembly 50 and the lower electrode assembly 10.

The substrate processing apparatus 1 according to an embodiment may further include an RF power controller 120 providing a plurality of RF power currents to the lower electrode assembly 10, a temperature controller 130 controlling a temperature of the substrate support 13, and an exhaust unit 160 adjusting internal pressure of the processing chamber 5 or discharging process gas in the processing chamber 5.

The RF power controller 120 may further include a first RF power generating device 122 electrically connected to the substrate support 13 and used to generate plasma in the plasma processing region PL, a second RF power generating device 124 electrically connected to the substrate support 13 and accelerating radicals or ions from plasma positioned in a central region of the substrate WF supported by the substrate support 13 onto the substrate WF, and a third RF power generating device 126 electrically connected to the electrode pillar 22a of the electrode structure 22 of the coupling ring assembly 16 and accelerating radicals or ions from plasma positioned on an edge region WFe of the substrate WF supported by the substrate support 13 onto the edge region WFe, while controlling a thickness, in the third direction, of a sheath of the plasma positioned on the edge region WFe of the substrate WF supported by the substrate support 13.

The substrate processing apparatus 1 according to an embodiment may further include an upper electrode controller 140 controlling temperature of the upper electrode assembly 50, a process gas supply unit 150 supplying a process gas into the plasma processing region PLR through shower holes 58 of the upper electrode assembly 50, and a grounding device 142 grounding the upper electrode controller 140.

The substrate processing apparatus 1 according to an embodiment may further include a system controller 110 automatically performing a plasma process, while controlling the RF power controller 120, the temperature controller 130, the exhaust unit 160, the upper electrode controller 140, and the process gas supply unit 150 overall.

In an example, the plasma process may be a plasma etching process performed on the substrate WF supported by the substrate support 13.

The side contact pad 30 and the at least one upper contact pad 28 may include or may be formed of the same material.

The side contact pad 30 and the at least one upper contact pad 28 may include or may be formed of silicone having conductive fillers 32. The conductive fillers 32 may be carbon nanotubes.

At least one of the side contact pad 30 and the at least one upper contact pad 28 may have a resistivity of about $10^{-3}$ Ω-m to about $10^4$ Ω-m.

In the side contact pad 30 and the at least one upper contact pad 28, a magnitude of the resistivity may be determined by the amount of the conductive fillers 32.

In an example, the side contact pad 30 and the at least one upper contact pad 28 may have the same resistivity.

In another example, the side contact pad 30 and the at least one upper contact pad 28 may have different resistivities.

At least one of a thickness, in the first direction, of the side contact pad 30 and a thickness, in third direction, of the at least one upper contact pad 28 may be within a range of about 0.2 mm to about 1 mm. For example, the thickness, in the first direction, of the side contact pad 30 may be within a range of about 0.2 mm to about 1 mm, and the thickness, in the third direction, of at least one of the at least one upper contact pad 28 may be within a range of about 0.2 mm to about 1 mm.

A minimum distance L between the electrode expansion ring 20 and the inner surfaces 18s1 and 18s2 of the coupling ring 18 may be within a range of about 1 mm to about 5 mm.

A distance D between the upper surface of the coupling ring 18 and the electrode expansion ring 20 may be determined by Equation 1 below.

$$d_{sh} \sim \frac{\sqrt{\epsilon_0 k_B T_e}}{\sqrt{n_e e^2}} \left( \frac{eV_{sh}}{k_B T_e} \right)^{3/4} \quad \text{[Equation 1]}$$

In Equation 1 above, the variables are representative of the following:

$d_{sh}$: sheath thickness
$k_B$: Boltzmann constant
$n_e$: electron density
$e$: basic charge amount
$T_e$: electron temperature
$V_{sh}$: sheath voltage
$\epsilon_0$: dielectric constant of dielectric of coupling ring.

Here, the electron density $n_e$ may be a plasma density, the basic charge amount e may be a charge amount of one electron, and the electron temperature $T_e$ may be an average kinetic energy in plasma.

In the graph of FIG. 3, $D_{break}$ may be a thickness at which breakdown of plasma sheath region occurs, $D_{min}$ may represent a minimum thickness capable of stably controlling a plasma sheath while maintaining breakdown, and $D_{max}$ may represent a maximum thickness at which plasma sheath may be stably controlled.

In an example, the thickness $D_{break}$ at which breakdown occurs may be about 0.2 mm, the minimum thickness $D_{min}$ may be about 0.5 mm, and the maximum thickness $D_{max}$ may be about 1.3 mm.

In an example, a distance D between the upper surface of the coupling ring 18 and the electrode expansion ring 20 may be within a range of about 0.5 mm to about 1.3 mm. The distance D may be the thickness of the graph of FIG. 3. As shown in the graph of FIG. 3, when the distance D between the upper surface of the coupling ring 18 and the electrode expansion ring 20 is within the range of about 0.5 mm to about 1.3 mm, a change in size of the sheath may be significant. Accordingly, when the distance D between the upper surface of the coupling ring 18 and the electrode expansion ring 20 is within the range of about 0.5 mm to about 1.3 mm, a transmission rate of power transmitted from the third RF power generating device 136 to the edge ring 25 may be improved. Accordingly, when the distance D between the upper surface of the coupling ring 18 and the electrode expansion ring 20 is within the range of about 0.5 mm to about 1.3 mm, a uniform plasma process may be performed.

Hereinafter, various modified examples of the substrate processing apparatus 1 described above will be described. Various modified examples of the substrate processing apparatus 1 to be described below will be mainly described based on a deformed component or a replaced component.

First, various modified examples of the side contact pad 30 will be described with reference to FIGS. 4A to 4D.

Figure 4A:
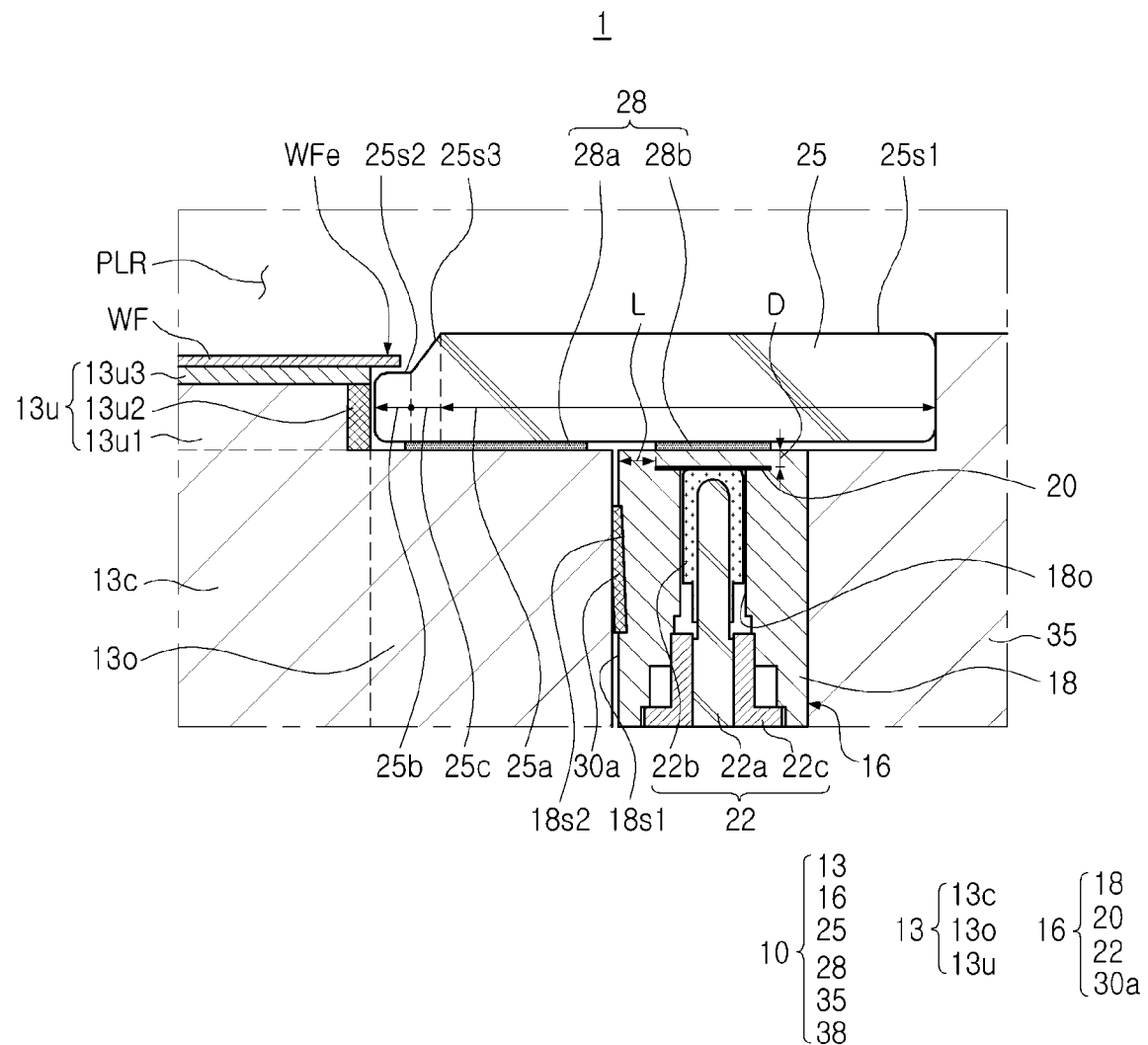
FIG. 4A is a partially enlarged cross-sectional view schematically illustrating a modified example of a substrate processing apparatus according to an example embodiment of the present inventive concept.
Figure 4B:
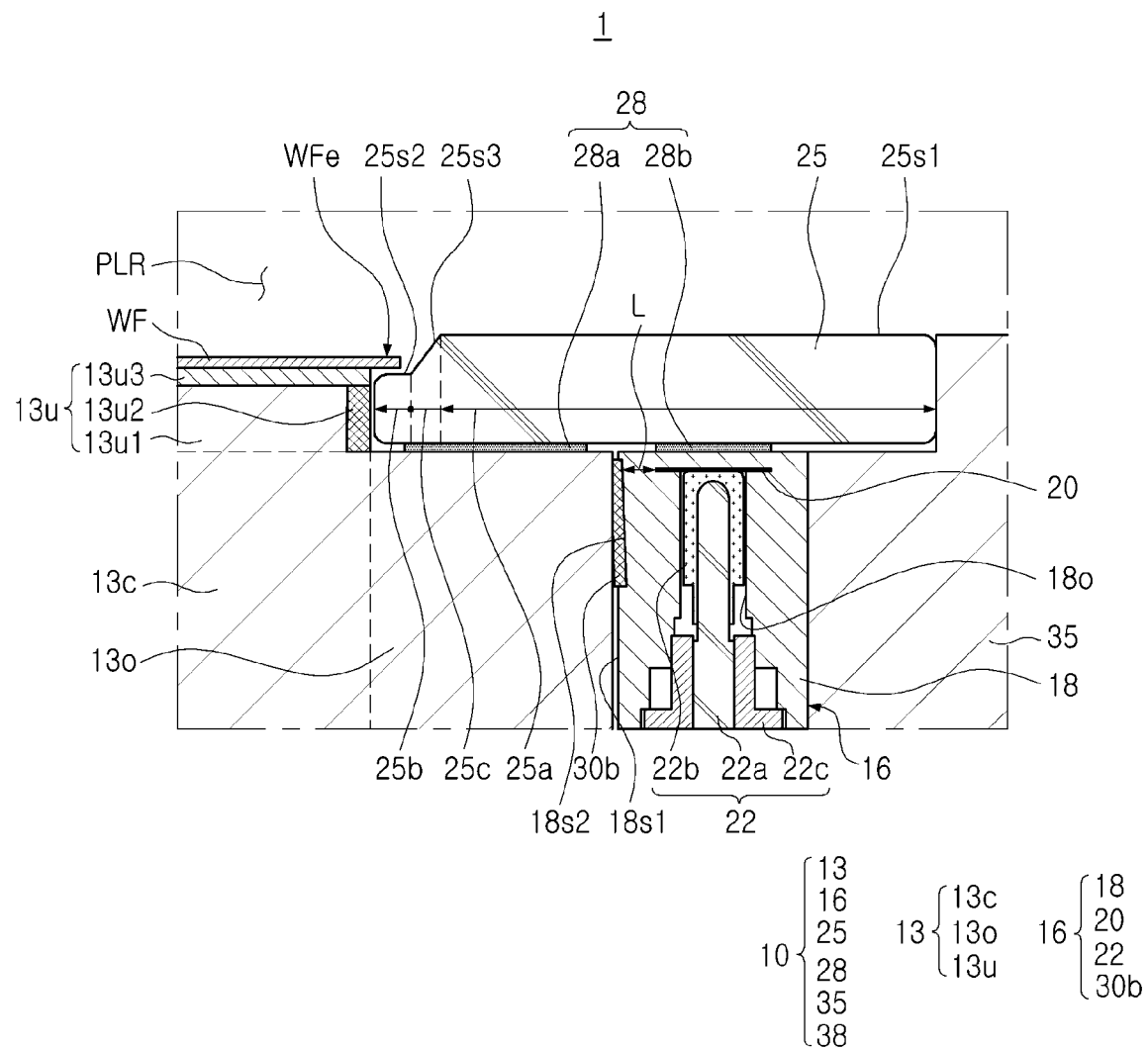
FIG. 4B is a partially enlarged cross-sectional view schematically illustrating a modified example of a substrate processing apparatus according to an embodiment of the present inventive concept.
Figure 4C:
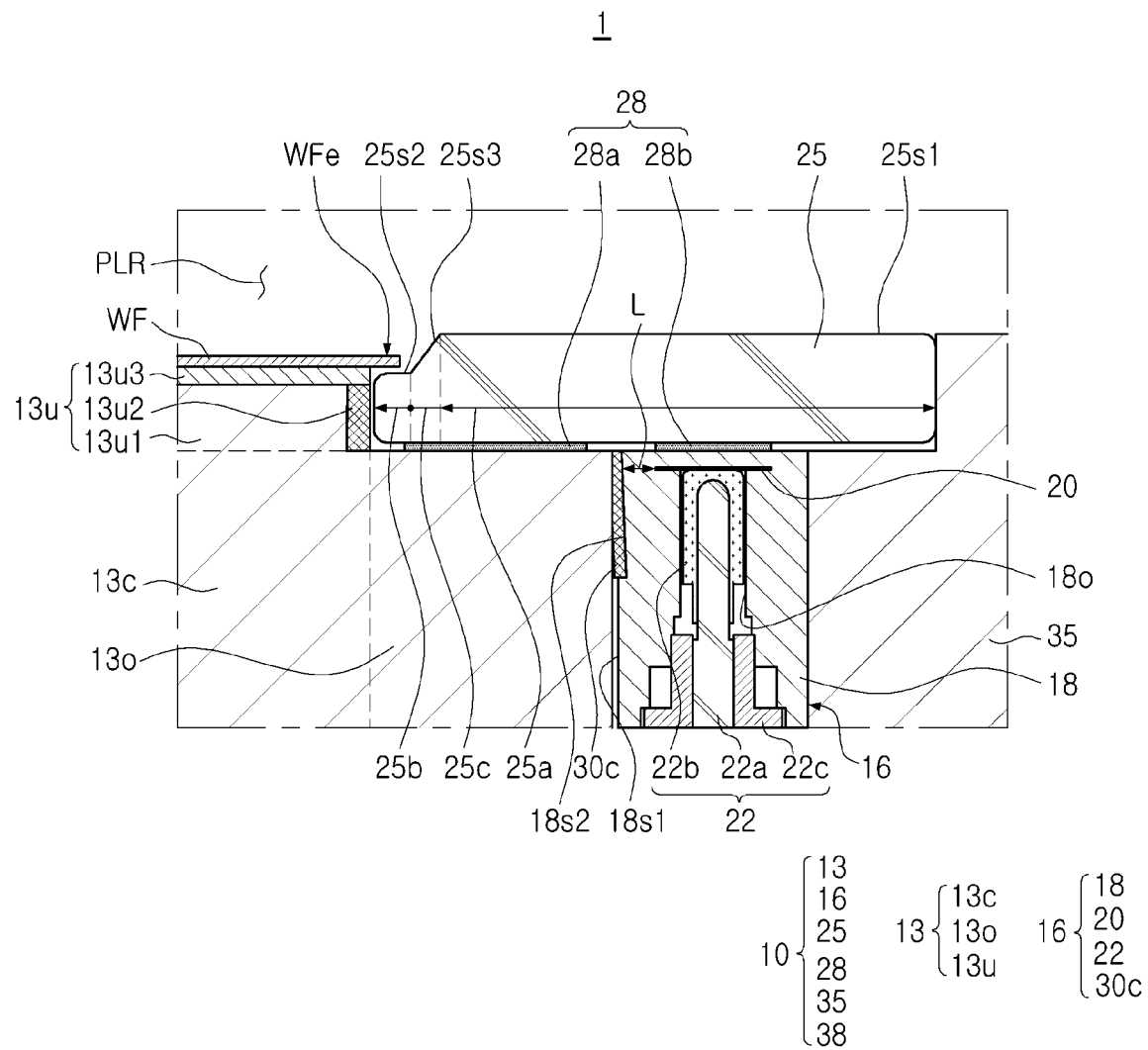
FIG. 4C is a partially enlarged cross-sectional view schematically illustrating a modified example of a substrate processing apparatus according to an example embodiment of the present inventive concept.
Figure 4D:
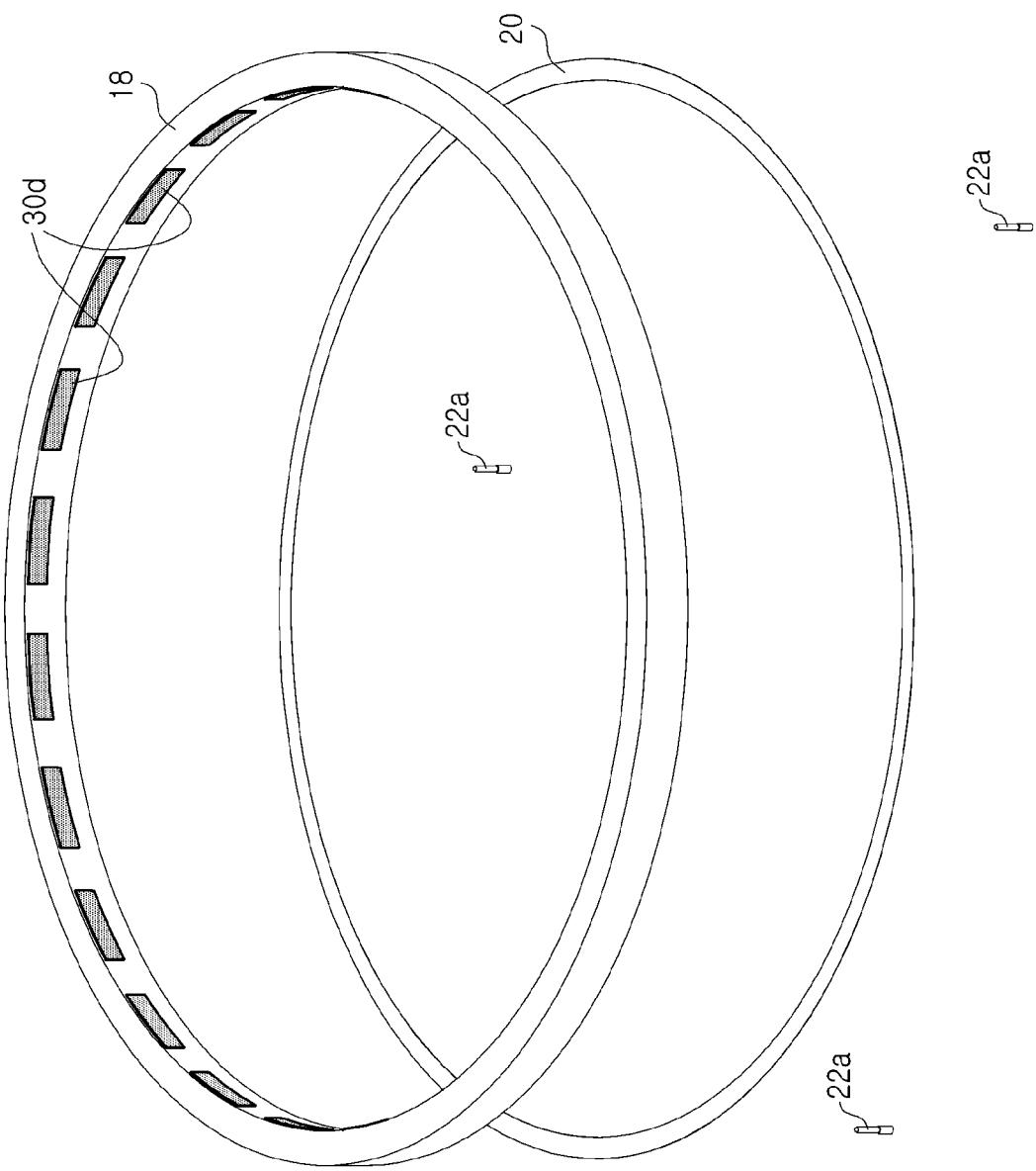
FIG. 4D is an exploded perspective view schematically illustrating a modified example of a substrate processing apparatus according to an embodiment of the present inventive concept.

FIGS. 4A to 4C are views schematically illustrating modified examples of the side contact pad 30 in the partially enlarged view of FIG. 2A in order to illustrate various modified examples of the side contact pad 30 in FIG. 2A, and FIG. 4D is a schematic exploded perspective view illustrating a modified example of a shape of the side contact pad 30 in the exploded perspective view of FIG. 3.

In a modified example, referring to FIG. 4A, an upper end of a side contact pad 30a of a modified example may be disposed at a level lower than that of the electrode expansion ring 20.

In a modified example, referring to FIG. 4B, an upper end of a side contact pad 30b of a modified example may be disposed at a level lower than that of the upper surface of the coupling ring 18 and at a level higher than that of the electrode expansion ring 20, and a lower end of the side contact pad 30b may be disposed at a level lower than that of the electrode expansion ring 20.

In a modified example, referring to FIG. 4C, an upper end of a side contact pad 30c of the modified example may be disposed at a level higher than that of the electrode expansion ring 20 and at a level substantially the same as that of the upper surface of the coupling ring 18, and a lower end of the side contact pad 30c may be disposed at a level lower than that of the electrode expansion ring 20.

In the inner surfaces 18s1 and 18s2 of the coupling ring 18 described above, the second inner surface 18s2 of the recessed region may extend to the upper surface of the coupling ring 18.

In a modified example, referring to FIG. 4D, the ring-shaped side contact pad 30 as shown in FIG. 3 may be replaced with a plurality of side contact pads 30d spaced apart from each other as in FIG. 4D.

Next, various modified examples of the at least one upper contact pad 28 will be described with reference to FIGS. 5A to 5C, respectively.

Figure 5A:
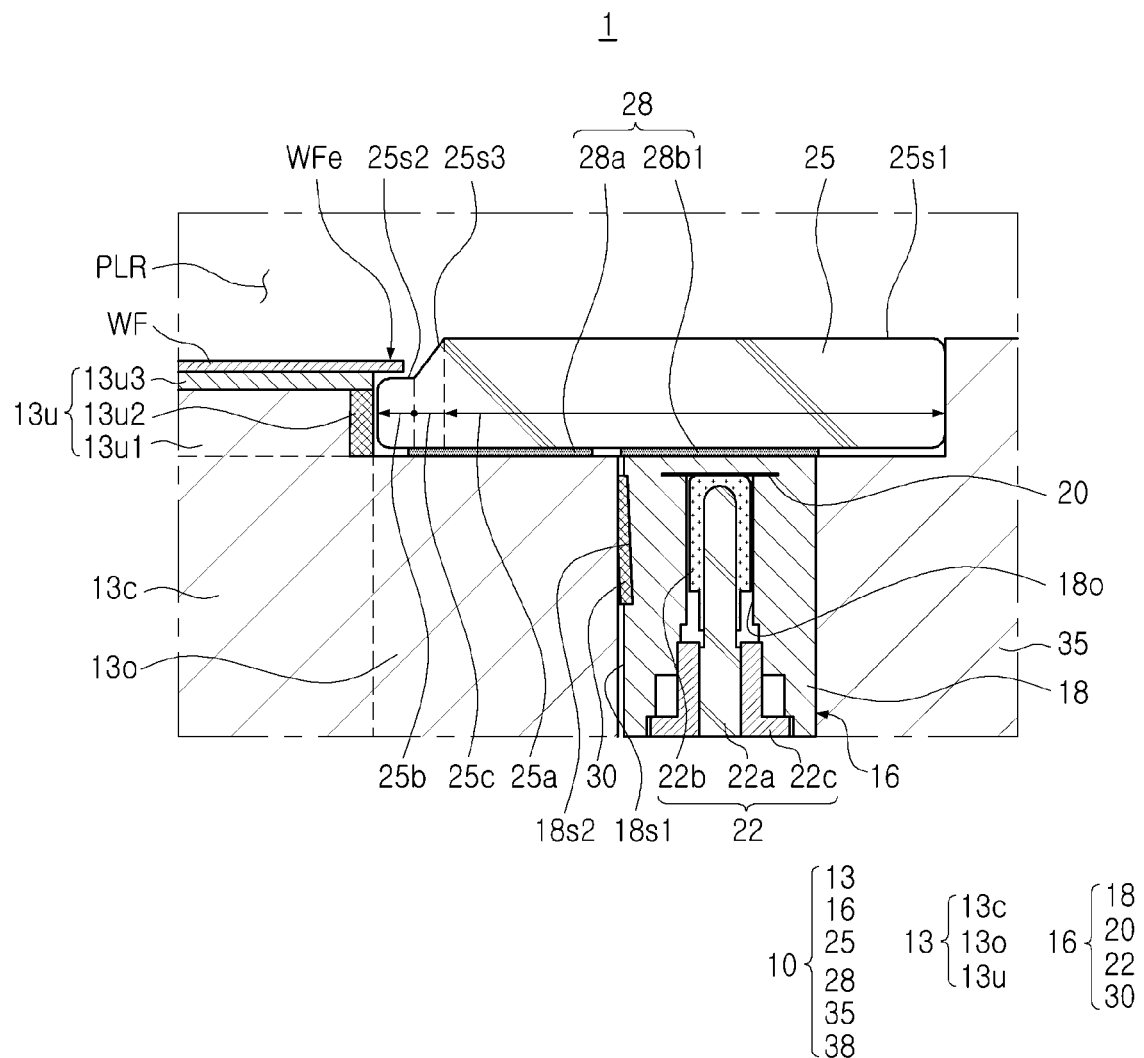
FIG. 5A is a partially enlarged cross-sectional view schematically illustrating a modified example of a substrate processing apparatus according to an example embodiment of the present inventive concept.
Figure 5B:
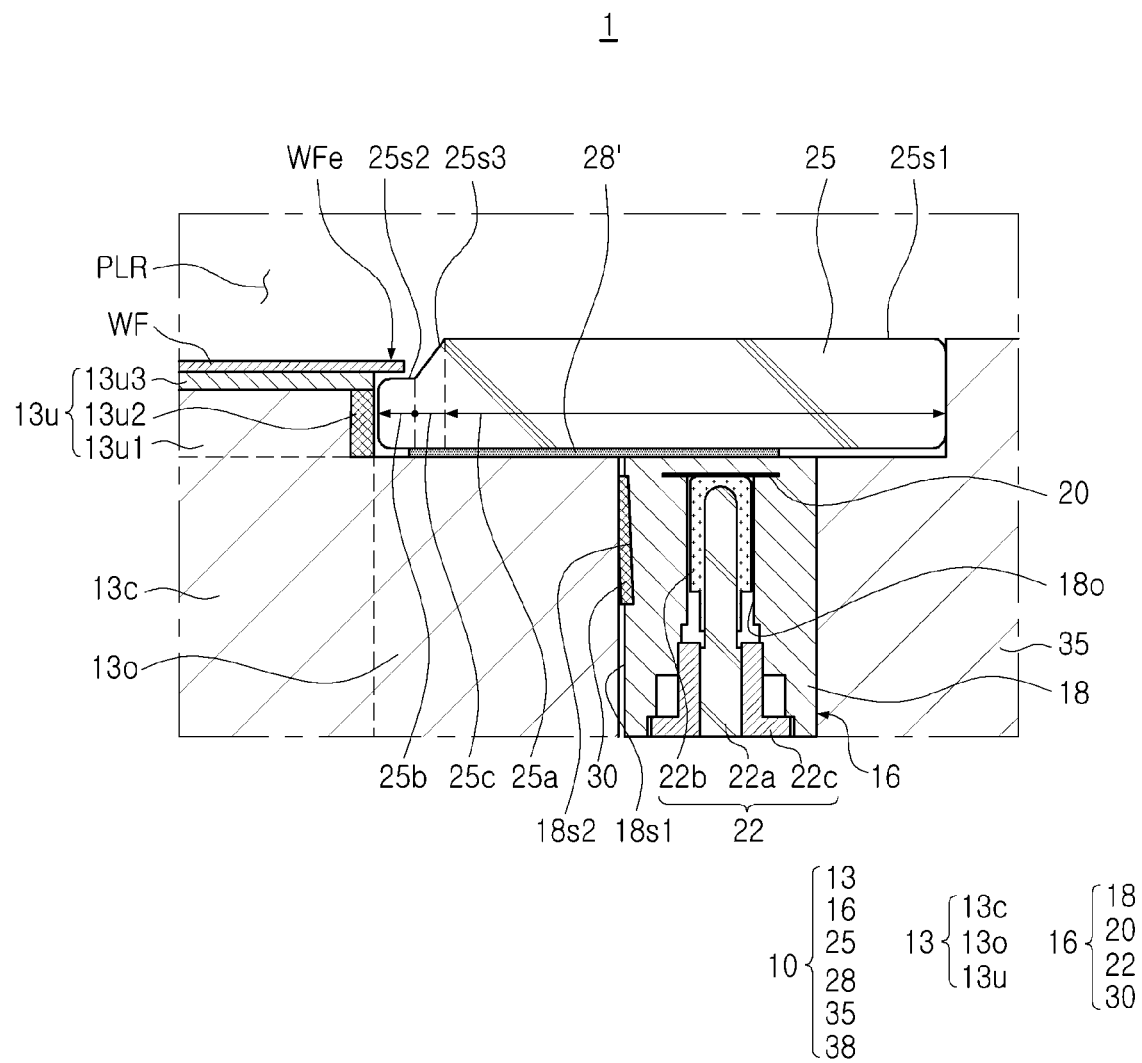
FIG. 5B is a partially enlarged cross-sectional view schematically illustrating a modified example of a substrate processing apparatus according to an embodiment of the present inventive concept.
Figure 5C:
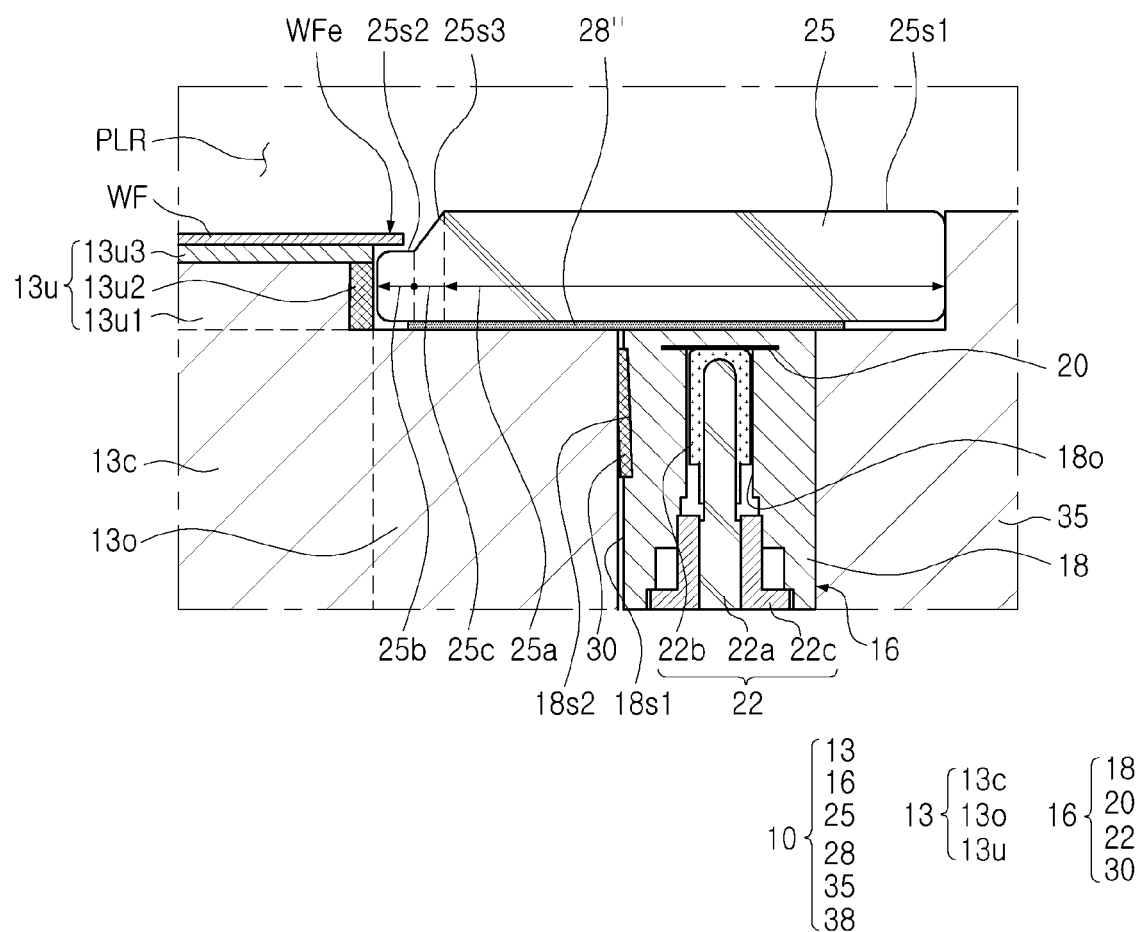
FIG. 5C is a partially enlarged cross-sectional view schematically illustrating a modified example of a substrate processing apparatus according to an embodiment of the present inventive concept.

FIGS. 5A to 5C are views schematically illustrating modified examples of the at least one upper contact pad 28 in the partially enlarged view of FIG. 2A to illustrate various modified examples of the upper contact pad 28 including the first upper contact pad 28a and the second upper contact pad 28b in FIG. 2A.

In a modified example, referring to FIG. 5A, the second upper contact pad 28b1 may cover the entire upper surface of the coupling ring 18 and contact the entire upper surface of the coupling ring 18.

In a modified example, referring to FIG. 5B, the first upper contact pad 28a and the second upper contact pad 28b described above with reference to FIG. 2A may be connected to each other, and the upper contact pad (28 of FIG. 2A) including the first upper contact pad 28a and the second upper contact pad 28b spaced apart from each other in FIG. 2A may be replaced with a single upper contact pad 28' as shown in FIG. 5B.

The upper contact pad 28' may cover at least a portion of an upper surface of the outer region 13o of the lower region 13c and 13o of the substrate support 13, contact a portion of the upper surface of the coupling ring 18, and overlap the electrode expansion ring 20. The upper contact pad 28' may have a ring shape.

In a modified example, referring to FIG. 5C, the upper contact pad 28' in contact with the partial upper surface of the coupling ring 18 described above with reference to FIG. 5B may be replaced with a single upper contact pad 28'' covering at least a portion of the upper surface of the outer region 13o of the lower region 13c and 13o of the substrate support 13 and covering the entire upper surface of the coupling ring 18.

Figure 9:
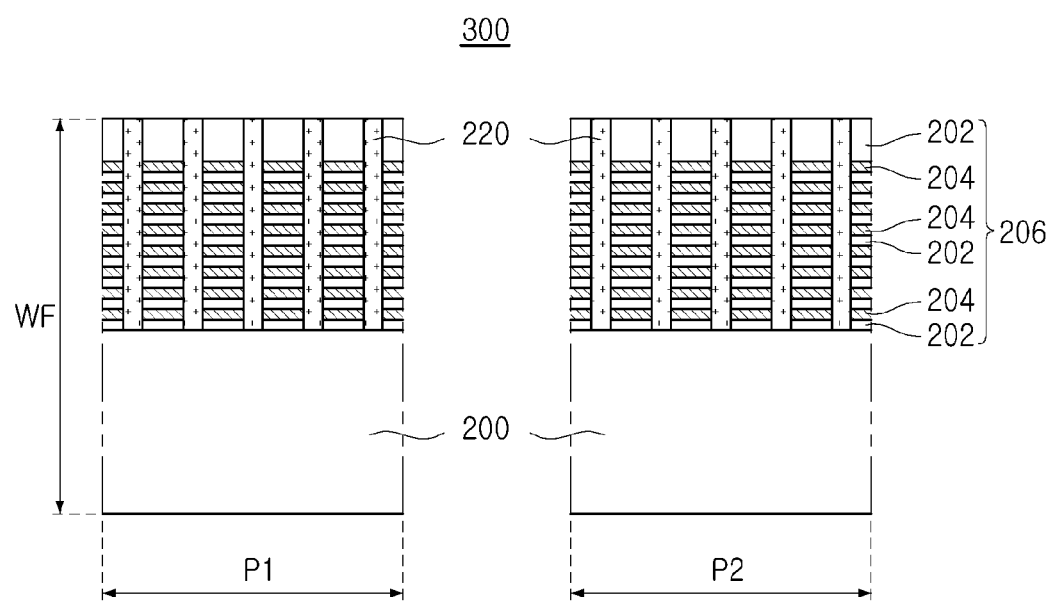

Next, a method of manufacturing a semiconductor device using a substrate processing apparatus according to embodiments of the present inventive concept will be described with reference to FIGS. 6 to 9. In FIGS. 6 to 9, FIG. 6 is a process flowchart schematically illustrating a method of manufacturing a semiconductor device using a substrate processing apparatus according to embodiments of the present inventive concept, and FIGS. 7A, 7B, 8A, 8B, 8C and 9 are schematic views illustrating a method of manufacturing a semiconductor device using a substrate processing apparatus according to embodiments of the present inventive concept. In FIGS. 7A, 7B, 8A, 8B, 8C, and 9, FIGS. 7A, 8A, 8B, and 8C are cross-sectional views illustrating a plasma etching process performed using the substrate processing apparatus 1 of FIG. 2A, and FIG. 9 is a cross-sectional view schematically illustrating an example of a semiconductor device manufactured using a substrate processing apparatus according to embodiments of the present inventive concept.

First, referring to FIGS. 1, 6, 7A, and 7B, the substrate processing apparatus 1 according to embodiments of the present inventive concept may be prepared (S10). The substrate processing apparatus 1 may be a substrate processing apparatus according to any one of various embodiments of the substrate processing apparatus 1 described above with reference to FIGS. 1 to 5C.

The substrate WF may be loaded onto the substrate support 13 in the substrate processing apparatus 1 (S20).

The substrate WF may include a lower structure 200 including a semiconductor substrate, a stack structure 206 including interlayer insulating layers 202 and gate layers 204 alternately and repeatedly stacked on the lower structure 200, and a mask pattern 210 formed on the stack structure 206 and including openings 210o.

Plasma may be generated in the plasma processing region (PLR of FIG. 1) (S30). Accordingly, a plasma region PL in which plasma is formed may be formed in the plasma processing region (PLR of FIG. 1). For example, a process gas may be supplied from the process gas supply unit 150 into the plasma processing region PLR, and the first RF power generating device 122 of the RF power controller 120 may supply a plasma generating frequency of about 50 MHz to about 100 MHz to the substrate support 13, which may be an electrostatic chuck ESC, to form the plasma region PL in which plasma is formed in the plasma processing region PLR.

Plasma sheath regions PLS1 and PLS2 that are simultaneously formed while plasma is formed may be formed between the generated plasma region PL and the substrate WF. The plasma sheath regions PLS1 and PLS2 may include a first sheath region PLS1 on the central region P1 of the substrate WF and a second sheath region PLS2 having a thickness changing in a direction from the edge region P2 of the substrate WF to the body region 25a of the edge ring 25. For example, a distance between the substrate WF and the plasma region PL may change in the edge region P2 of the substrate WF. The distance between the substrate WF and the plasma region PL may increase in the edge region P2 of the substrate WF.

The plasma of the plasma region PL may be capacitively coupled plasma (CCP). The plasma region PL may include radicals or reactive ions Pi for an etching process.

Referring to FIGS. 1, 6, 8A and 8B, the plasma process may be performed, while heat occurring in the plasma processing region PLR on the edge ring 25 is dissipated through the edge ring 25, the upper contact pad 28, the coupling ring 18, the side contact pad 30, and the substrate support 13 (S40). Accordingly, in the plasma process, the upper contact pad 28 and the side contact pad 30 may serve to lower a temperature of the edge ring 25.

While controlling a thickness of the second sheath region PLS2 by supplying a frequency of about 200 kHz to about 2 MHz of first power to the substrate support 13 by the second RF power generating device 124 and supplying a frequency of about 200 kHz to about 2 MHz of second power weaker than the first power to the edge ring 25 by the third RF power generating device 126 through the coupling ring assembly 16, radicals or ions Pi in the plasma PL may be accelerated toward the substrate WF to anisotropically etch the stack structure 206 exposed by the openings 210o of the mask pattern 210. Accordingly, holes 206H penetrating through the stack structure 206 may be formed.

An interface between the plasma region PL and the sheath regions PLS1 and PLS2 may be parallel to the entire upper surface of the substrate WF. Since radicals or ions Pi in the plasma region PL are accelerated in a direction, perpendicular to the interface between the plasma region PL and the sheath regions PLS1 and PLS2, the holes 206H may be uniformly formed over the entire area of the stack structure 206. Accordingly, a uniform plasma process, for example, a plasma etching process, may be performed.

Figure 6:
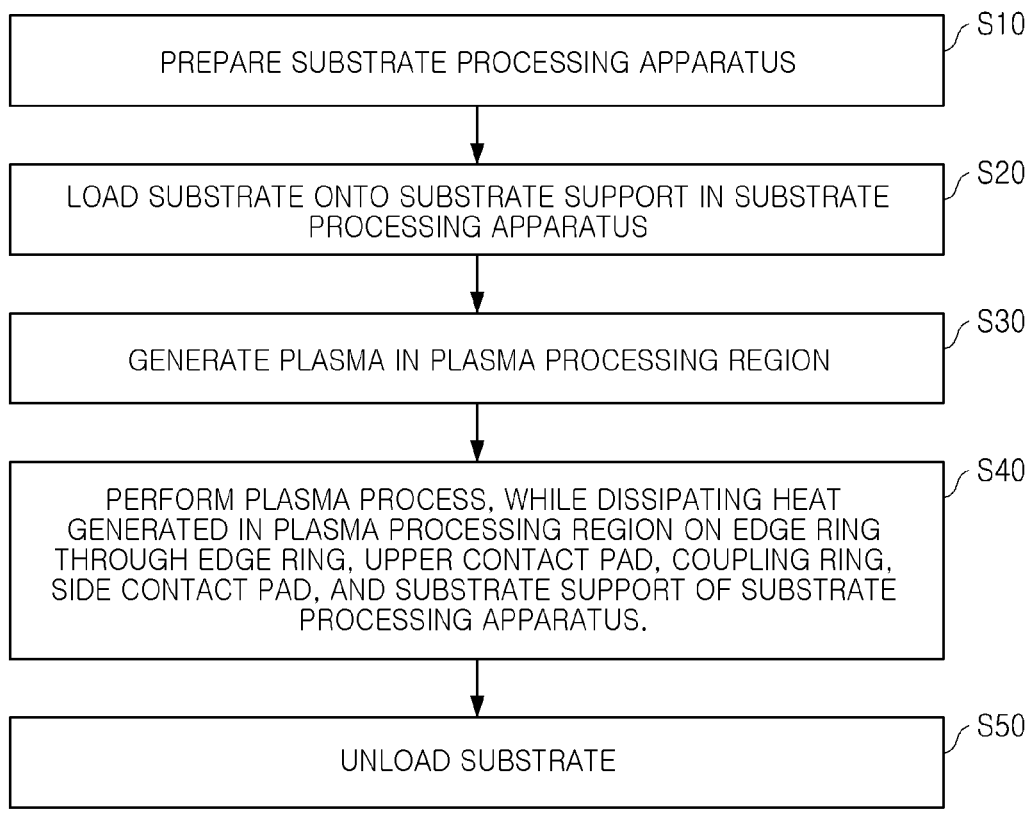
FIG. 6 is a flowchart schematically illustrating a method of manufacturing a semiconductor device using a substrate processing apparatus according to embodiments of the present inventive concept.
Figure 7A:
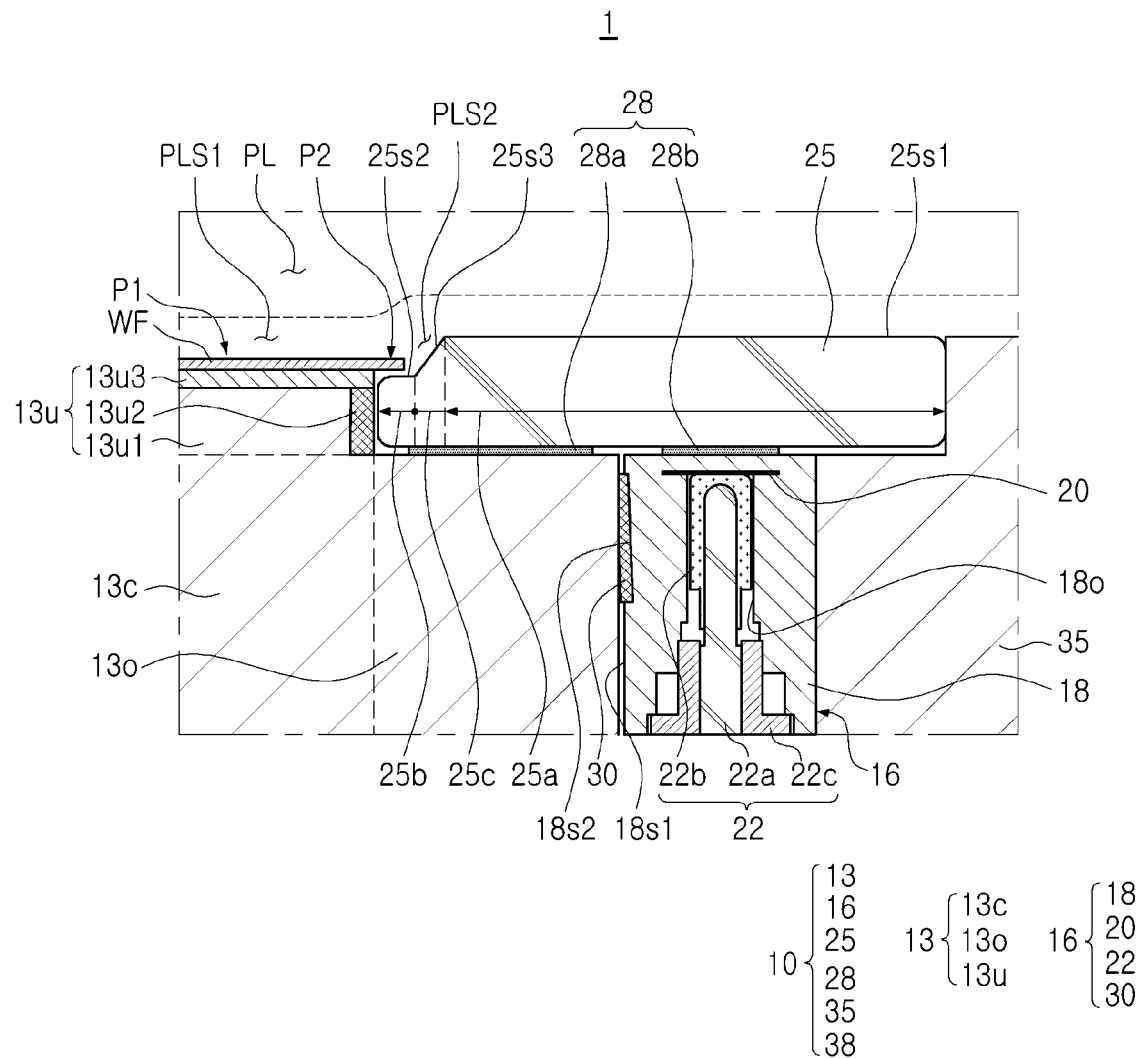
FIGS. 7A, 7B, 8A, 8B, 8C, and 9 are schematic views illustrating a method of manufacturing a semiconductor device using a substrate processing apparatus according to embodiments of the present inventive concept.
Figure 7B:
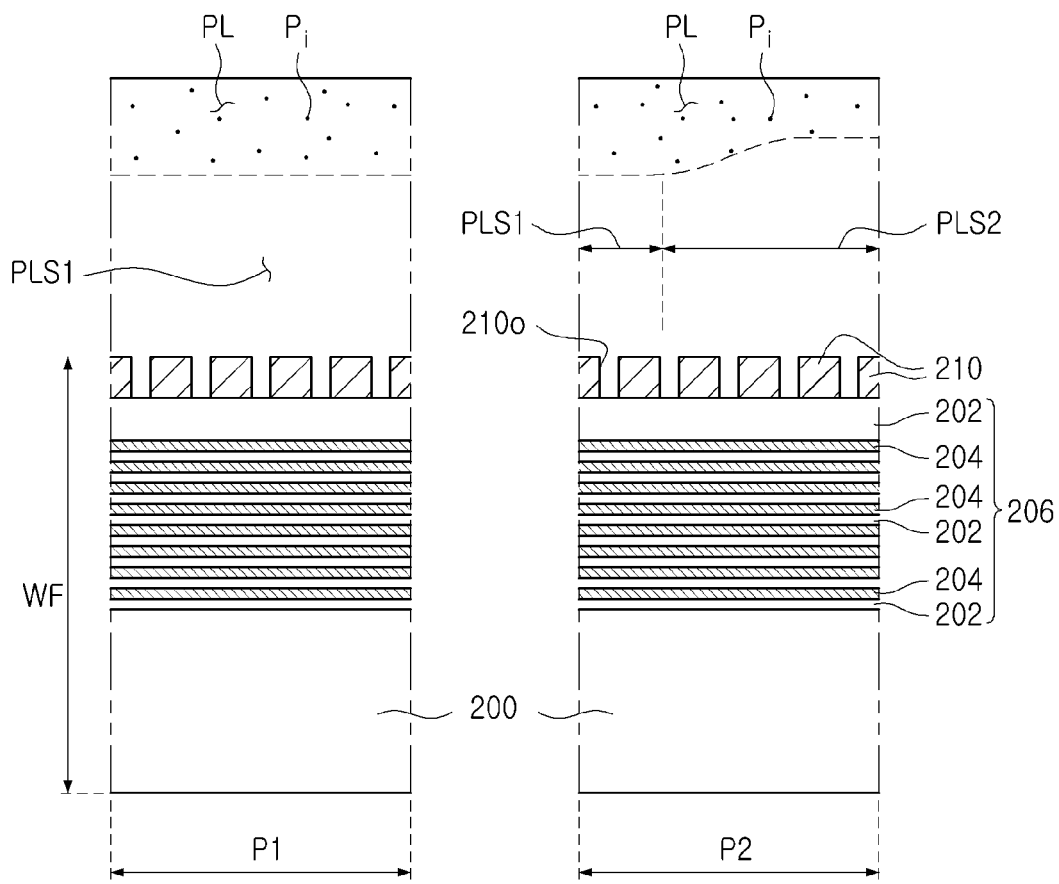
Figure 8A:
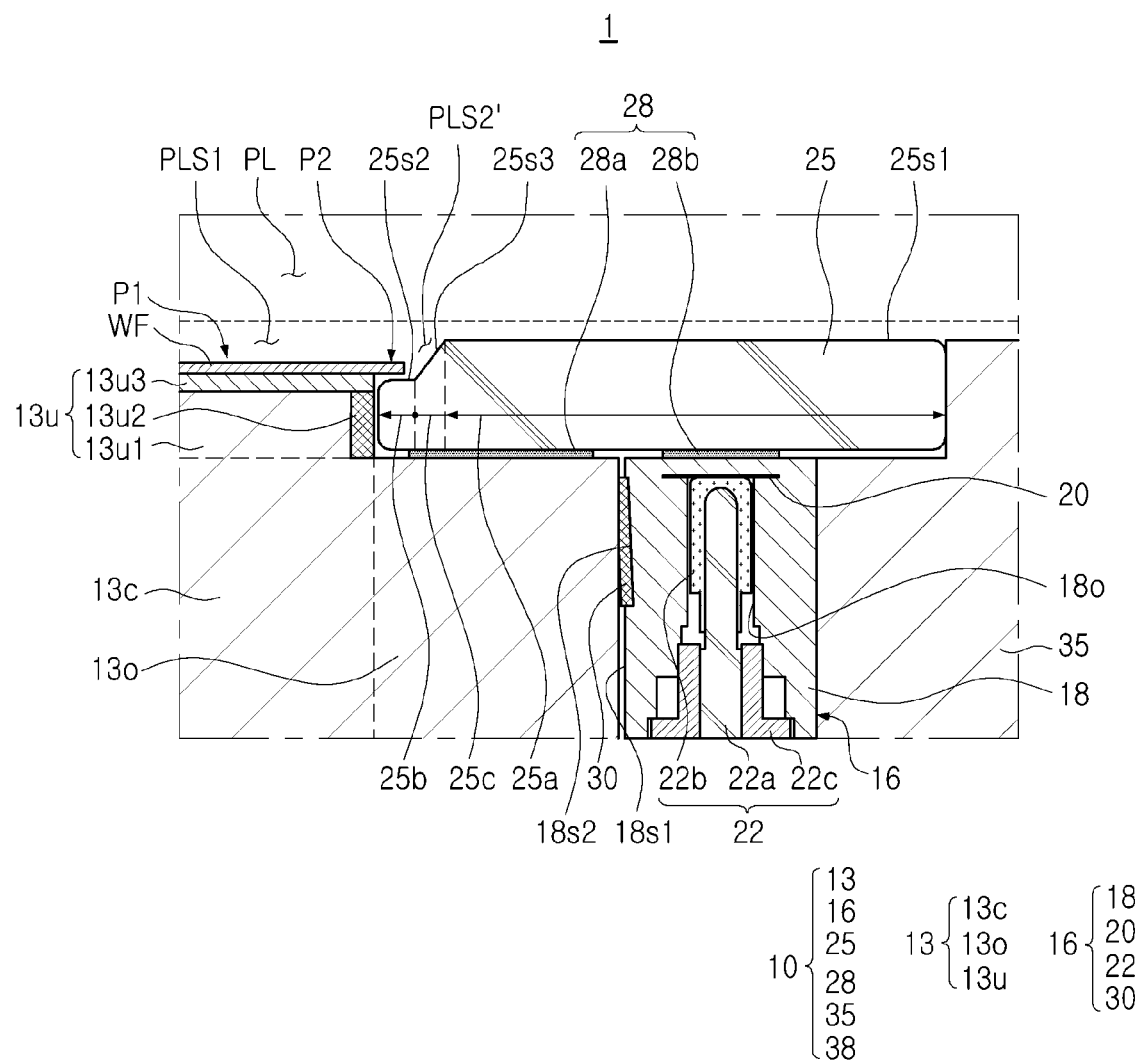
Figure 8B:
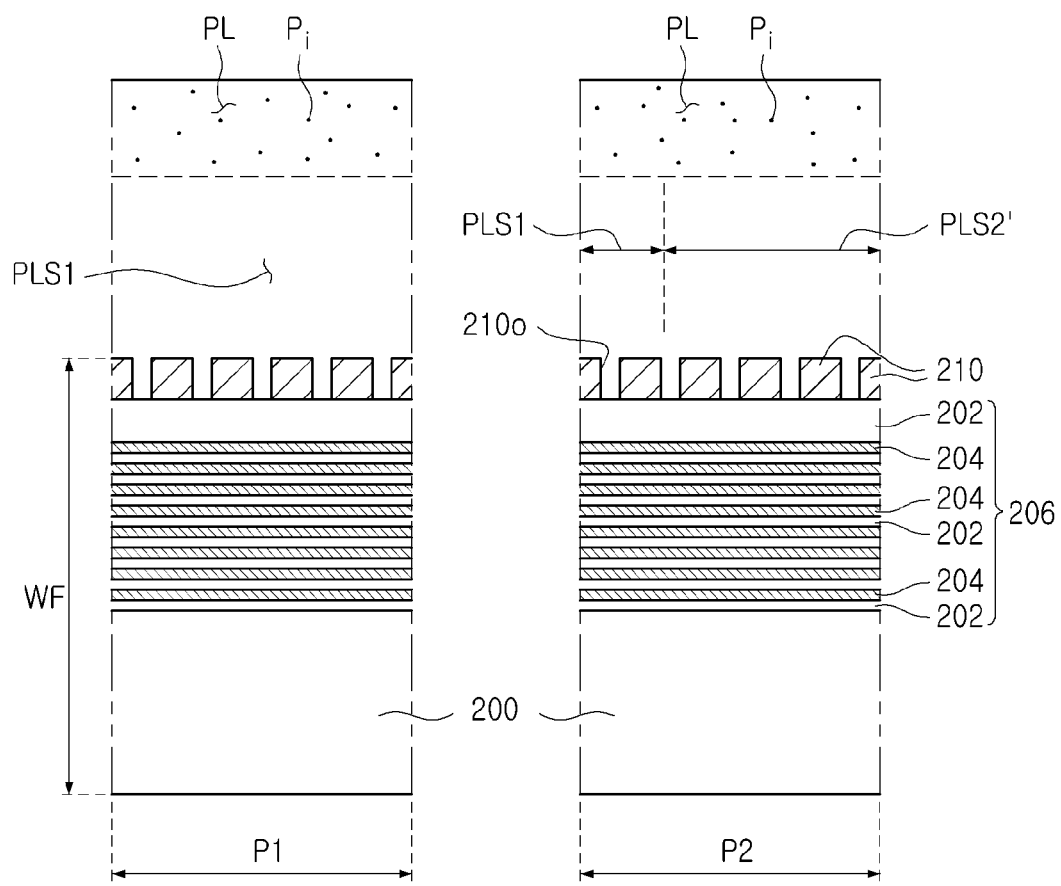
Figure 8C:
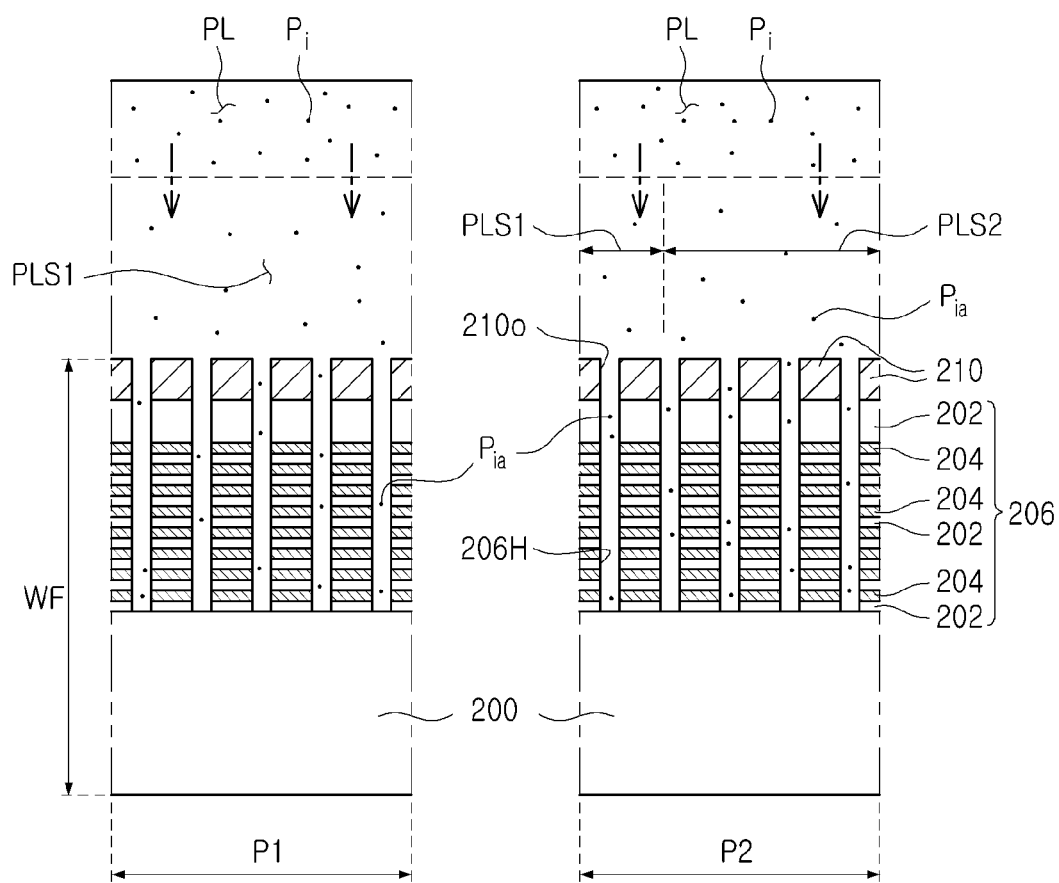

Referring to FIGS. 1, 6, and 9, after the holes 206H are formed, the plasma process may be terminated. Subsequently, the substrate WF may be unloaded (S50).

After the substrate WF is unloaded from the substrate processing apparatus 1, an additional semiconductor process may be performed. For example, after the substrate WF is unloaded from the substrate processing apparatus 1, vertical structures 220 may be formed in the holes 206H. While forming the vertical structures 220, the mask patterns (210 of FIG. 8C) may be removed.

In an embodiment, when the gate layers 204 are formed of a conductive material such as polysilicon, the gate layers 204 may remain.

In another embodiment, when the gate layers 204 are formed of an insulating material such as silicon nitride, a process of replacing the gate layers 204 with gate layers including a conductive material may be further performed.

Each of the vertical structures 220 may include an information storage layer and a channel layer. For example, each of the vertical structures 220 may include a charge trap layer capable of storing information by trapping a charge in a NAND flash memory device.

Accordingly, a semiconductor device 300 such as a NAND flash memory device including the vertical structures 220 may be manufactured.

In the embodiments described above, since the lower electrode assembly 10 includes the at least one upper contact pad 28 and the side contact pad 30 to implement a low impedance structure, a sheath voltage may be strengthened.

In addition, since the at least one upper contact pad 28 and the side contact pad 30 are included, the temperature of the edge ring 25 may be lowered during a plasma process. Accordingly, since a more uniform plasma process may be performed, defects that may occur as the holes 206H formed in the edge region P2 of the substrate WF, among the holes 206H of the substrate WF, are not opened or are deformed may be prevented.

In the embodiments described above, since the temperature of the edge ring 25 may be lowered during the plasma process by including the at least one upper contact pad 28 and the side contact pad 30, an etch rate of the edge ring 25 during the plasma process may be lowered. Accordingly, a replacement cycle of the edge ring 25 that occurs while repeatedly performing the plasma process may be longer.

In the embodiments described above, since the at least one upper contact pad 28 may be formed of silicone including conductive fillers such as carbon nanotubes, the at least one upper contact pad 28 may have elasticity. Thus, when the at least one upper contact pad 28 attached to the lower surface of the edge ring 25 may serve to alleviate an impact with the edge ring 25, the substrate support 13, and the coupling ring 18 when the edge ring is replaced. Accordingly, the at least one upper contact pad 28 may prevent defects such as cracks occurring when the edge ring 25 is replaced.

In the embodiments described above, since the temperature of the edge ring 25 may be lowered during the plasma process, a polymer, among etching byproducts occurring during the formation of the holes 206H by etching the stacked structure 206, may be deposited on the edge ring 25, rather than being deposited on the surface of the substrate WF. Accordingly, a more uniform plasma etching process may be performed on the substrate WF.

As set forth above, according to embodiments of the present inventive concept, a substrate processing apparatus and a method for manufacturing a semiconductor device using the same may be provided. The substrate processing apparatus may include a coupling ring assembly surrounding a substrate support, an edge ring on the coupling ring assembly, and an upper contact pad in contact with a lower surface of the edge ring and in contact with at least an upper surface of the coupling ring assembly. The coupling ring assembly may include a coupling ring and a side contact pad contacting a side surface of the substrate support and an inner surface of the coupling ring.

Since the substrate processing apparatus includes the upper contact pad and the side contact pad, a uniform plasma process may be performed, while controlling a plasma sheath region.

Various and beneficial advantages and effects of embodiments of the present inventive concept are not limited to the above, and will be more easily understood in the course of describing specific embodiments of the present inventive concept.

While example embodiments have been shown and described above, it will be apparent to those skilled in the art that modifications and variations could be made without departing from the scope of the present inventive concept as defined by the appended claims.

What is claimed is:

1. A substrate processing apparatus comprising:
a substrate support configured to support a substrate, the substrate support including a lower region and an upper region, the lower region including a central region and an outer region surrounding the central region, and the upper region being disposed on the central region of the lower region;
a coupling ring assembly surrounding a side surface of the lower region of the substrate support;
an edge ring disposed on the coupling ring assembly and the outer region of the lower region of the substrate support and surrounding a side surface of the upper region of the substrate support; and
at least one upper contact pad contacting a lower surface of the edge ring and contacting an upper surface of the outer region of the lower region of the substrate support and an upper surface of the coupling ring assembly, the at least one upper contact pad being conductive,
wherein the coupling ring assembly includes:
a coupling ring; and
a conductive side contact pad in contact with a side surface of the substrate support and an inner surface of the coupling ring.

2. The substrate processing apparatus of claim 1, wherein at least one of the side contact pad and the at least one upper contact pad has resistivity of about $10^{-3}$ Ω-m to about $10^{4}$ Ω-m.

3. The substrate processing apparatus of claim 1, wherein the side contact pad and the at least one upper contact pad include silicone having conductive fillers.

4. The substrate processing apparatus of claim 3, wherein the conductive fillers are carbon nanotubes.

5. The substrate processing apparatus of claim 1, wherein a thickness of at least one of the side contact pad and the at least one upper contact pad is in a range of about 0.2 mm to about 1 mm.

6. The substrate processing apparatus of claim 1, wherein the coupling ring has a lower opening, and
the coupling ring assembly further includes:
an electrode expansion ring disposed in the coupling ring and partially overlapping the lower opening; and
an electrode structure inserted into the lower opening and contacting the electrode expansion ring.

7. The substrate processing apparatus of claim 6, wherein the coupling ring is formed of a dielectric material, and
a distance between an upper surface of the coupling ring and the electrode expansion ring is in a range of about 0.5 mm to about 1.3 mm.

8. The substrate processing apparatus of claim 6, wherein a thickness of the electrode expansion ring is in a range of about 5 μm to about 15 μm.

9. The substrate processing apparatus of claim 6, wherein the coupling ring has the inner surface facing the substrate support and spaced apart from the substrate support,
the inner surface of the coupling ring has a first inner surface, perpendicular to an upper surface of the coupling ring, and a second inner surface in a recessed region, relative to the first inner surface, and the side contact pad is attached to the second inner surface of the recessed region, and protrudes, relative to the first inner surface, to be in contact with the substrate support.

10. The substrate processing apparatus of claim 9, wherein,
in the inner surface of the coupling ring, the second inner surface of the recessed region is inclined with respect to the upper surface of the coupling ring, and
the side contact pad includes a first side surface entirely in contact with the inner surface of the coupling ring and a second side surface in which a first portion facing the first side surface is in contact with the substrate support and a second portion facing the first side surface is spaced apart from the substrate support.

11. The substrate processing apparatus of claim 6, wherein
the at least one upper contact pad is in contact with the lower surface of the edge ring, an upper surface of the outer region of the lower region of the substrate support, and an upper surface of the coupling ring.

12. The substrate processing apparatus of claim 1, wherein
the at least one upper contact pad includes a first upper contact pad and a second upper contact pad spaced apart from each other,
the first upper contact pad is in contact with the lower surface of the edge ring and the upper surface of the outer region of the lower region of the substrate support, and
the second upper contact pad is in contact with the lower surface of the edge ring and an upper surface of the coupling ring.

13. The substrate processing apparatus of claim 1, wherein
the upper region of the substrate support includes:
an upper support protruding from the central region of the lower region;
a protective layer surrounding a side surface of the upper support; and
a capping layer covering an upper surface of the upper support and an upper surface of the protective layer,
wherein the edge ring includes:
a body region having a flat first upper surface;
an inner region having a flat second upper surface positioned at a level lower than a level of the first upper surface; and
a buffer region disposed between the body region and the inner region and having an inclined surface extending from the first upper surface to the second upper surface,
the inner region of the edge ring has a side surface facing a side surface of the upper region of the substrate support and has a thickness less than a thickness of the upper region of the substrate support,
the body region of the edge ring has a thickness greater than a thickness of the upper region of the substrate support,
the lower surface of the edge ring is flat,
the body region covers the entire upper surface of the coupling ring and covers a portion of the upper surface of the outer region of the lower region of the substrate support, and
at least a portion of the inner region of the edge ring vertically overlaps an edge region of the substrate supported by the substrate support.

14. A substrate processing apparatus comprising:
a lower electrode assembly;
an upper electrode assembly on the lower electrode assembly; and
a plasma processing region between the lower electrode assembly and the upper electrode assembly,
wherein the lower electrode assembly includes:
a substrate support configured to support a substrate;
a coupling ring assembly surrounding the substrate support;
an edge ring on the coupling ring assembly; and
at least one upper contact pad contacting a lower surface of the edge ring and contacting at least one of the substrate support and the coupling ring assembly, the at least one upper contact pad being conductive,
wherein the coupling ring assembly includes:
a coupling ring; and
a conductive side contact pad in contact with a side surface of the substrate support and an inner surface of the coupling ring.

15. The substrate processing apparatus of claim 14, further comprising a plasma confinement ring defining a side of the plasma processing region.

16. The substrate processing apparatus of claim 14, wherein
at least one of the side contact pad and the at least one upper contact pad has resistivity of about $10^{-3}$ Ω-m to about $10^4$ Ω-m.

17. The substrate processing apparatus of claim 14, wherein
the coupling ring includes a lower opening,
the coupling ring assembly includes:
an electrode expansion ring disposed in the coupling ring and partially overlapping the lower opening; and
an electrode structure inserted into the lower opening and contacting the electrode expansion ring,
the coupling ring is formed of a dielectric material, and
a distance between an upper surface of the coupling ring and the electrode expansion ring is in a range of about 0.5 mm to about 1.3 mm.

18. The substrate processing apparatus of claim 17, further comprising:
a first RF power generating device electrically connected to the substrate support and used to generate plasma in the plasma processing region;
a second RF power generating device electrically connected to the substrate support and accelerating radicals or ions from plasma positioned in a central region of the substrate supported by the substrate support onto the substrate; and
a third RF power generating device electrically connected to the electrode structure of the coupling ring assembly and accelerating radicals or ions from plasma positioned on an edge region of the substrate supported by the substrate support onto the edge region, while controlling a thickness of a sheath of the plasma positioned on the edge region of the substrate supported by the substrate support.

19. A method of manufacturing a semiconductor device, the method comprising:
preparing a substrate processing apparatus including a lower electrode assembly, an upper electrode assembly disposed on the lower electrode assembly, and a plasma processing region between the lower electrode assembly and the upper electrode assembly, wherein the lower electrode assembly of the substrate processing apparatus includes a substrate support supporting a substrate, a coupling ring assembly surrounding the substrate support, an edge ring on the coupling ring assembly, and at least one conductive upper contact pad contacting at least one of the substrate support and the coupling ring assembly, while contacting a lower surface of the edge ring, and the coupling ring assembly includes a conductive side contact pad contacting a side surface of the substrate support and the coupling ring assembly and contacting an inner surface of the coupling ring assembly;

loading the substrate onto the substrate support in the substrate processing apparatus;

generating plasma in the plasma processing region to form a plasma region; and performing plasma processing, while heat generated in the plasma processing region on the edge ring is dissipated through the edge ring, the at least one upper contact pad, the coupling ring assembly, the side contact pad, and the substrate support of the substrate processing apparatus.

20. The method of claim 19, further comprising:

unloading the substrate from the substrate processing apparatus; and performing additional semiconductor process on the unloaded substrate, wherein the substrate processing apparatus further includes a first RF power generating device and a second RF power generating device electrically connected to the substrate support and a third RF power generating device electrically connected to an electrode of the coupling ring assembly, wherein the forming of the plasma region by generating the plasma in the plasma processing region includes supplying a plasma generating frequency of about 50 MHz to about 100 Mhz to the substrate support through the first RF power generating device, and wherein the performing of the plasma processing includes controlling a thickness of a plasma sheath formed together as the plasma is generated, by supplying a frequency of about 200 kHz to about 2 MHz of a second power less than a first power to the edge ring through the coupling ring assembly, while supplying a frequency of about 200 kHz to about 2 MHz of the first power to the substrate support.

* * * * *